(12) United States Patent
Vollrath

(10) Patent No.: US 7,719,868 B2
(45) Date of Patent: May 18, 2010

(54) INTEGRATED SEMICONDUCTOR MEMORY

(75) Inventor: Joerg Vollrath, Olching (DE)

(73) Assignee: Qimonda AG, Munich (DE)

( * ) Notice: Subject to any disclaimer, the term of this patent is extended or adjusted under 35 U.S.C. 154(b) by 484 days.

(21) Appl. No.: 11/715,839

(22) Filed: Mar. 8, 2007

(65) Prior Publication Data
US 2007/0211509 A1    Sep. 13, 2007

(30) Foreign Application Priority Data
Mar. 8, 2006  (DE) .................. 10 2006 010 762

(51) Int. Cl.
G11C 5/06 (2006.01)
(52) U.S. Cl. .................. 365/63; 365/149; 365/233.13
(58) Field of Classification Search .................. 365/63, 365/149, 202
See application file for complete search history.

(56) References Cited

U.S. PATENT DOCUMENTS

| 5,107,459 | A | * | 4/1992 | Chu et al. .................. 365/63 |
| 5,715,189 | A | | 2/1998 | Asakura |
| 5,966,315 | A | | 10/1999 | Muller et al. |
| 6,038,158 | A | | 3/2000 | Bessho et al. |
| 6,657,880 | B1 | * | 12/2003 | Callahan .................. 365/63 |
| 2005/0045918 | A1 | * | 3/2005 | Reith .................. 257/208 |
| 2007/0050743 | A1 | * | 3/2007 | Batra .................. 716/10 |

FOREIGN PATENT DOCUMENTS

DE    691 05 334 T2    5/1995

* cited by examiner

*Primary Examiner*—Vu A Le
*Assistant Examiner*—Han Yang
(74) *Attorney, Agent, or Firm*—Slater & Matsil, L.L.P.

(57) ABSTRACT

An integrated semiconductor memory has memory cells, with at least one pair of bit lines which comprises a first bit line and a second bit line, and with at least one sense amplifier which has the first bit line and the second bit line connected to it. The bit lines respectively have a first conductor track structure and a second conductor track structure, where the memory cells are respectively connected to the second conductor track structure, and where the first conductor track structure is respectively interposed between the sense amplifier and the second conductor track structure of the respective bit line and is arranged at a greater distance from the substrate area than the respective second conductor track structure.

39 Claims, 5 Drawing Sheets

INTEGRATED SEMICONDUCTOR MEMORY

This application claims priority to German Patent Application 10 2006 010 762.4, which was filed Mar. 8, 2006, and is incorporated herein by reference.

TECHNICAL FIELD

The invention relates generally to semiconductor devices and in particular embodiments to an integrated semiconductor memory.

BACKGROUND

Integrated semiconductor memories, particularly DRAMs (Dynamic Random Access Memory) have a multiplicity of memory cells that are arranged in a memory cell array and which are connected to word lines and bit lines. In the case of a DRAM, the memory cells respectively have a storage capacitor and a selection transistor. Other types of memory cells are also usually provided with a selection transistor. The selection transistors are usually in the form of MOSFETs (Metal Oxide Semiconductor Field Effect Transistor) in which the gate electrodes are respectively sections of word lines. The selection transistors also comprise two source/drain regions, one of which is connected to the storage capacitor and the other source/drain region of which is electrically conductively connected to the bit line to which the memory cell is connected. The gate electrode is usually isolated by means of a gate oxide layer from a channel region which is arranged between the two source/drain regions in the substrate and in which an inversion channel flows at suitable electrode voltages.

To read a memory cell, the selection transistor is turned on and thereby makes the electrical connection between the trench capacitor and the bit line, as a result of which the potential of the bit line is altered according to the bias voltage on the transistor's capacitor electrode. Sense amplifiers compare the electrical potentials on two bit lines and spread the bit line potentials when reading and refreshing volatile memory cells. The sense amplifiers are therefore also called signal amplifiers or differential amplifiers, since they amplify the difference between electrical potentials.

Normally, each sense amplifier has two bit lines connected to it whose potentials are compared with one another by the sense amplifier. The two bit lines are called "True" and "Complement", where "True" denotes that bit line to which the respective memory cell which is to be read is connected. The respective other (complementary) bit line is called "Complement", since it is used only to provide a comparison potential, with respect to which the potential on the "True" bit line is altered after the charge previously stored in the memory cell which is to be read has been distributed over the entire "True" bit line. The sense amplifier identifies a resultant potential difference and then biases the bit lines with potentials whose potential difference is considerably greater than the initially identified potential difference and in any case has the same arithmetic sign. This allows data values which have been read to be written back or forwarded.

Depending on whether the two bit lines whose potential difference is measured and amplified by the sense amplifier are arranged on the same side or on opposite sides of the sense amplifier, reference is made to the "Folded bit line" concept or the "Open bit line" concept. In the case of the open bit line concept, the mutually complementary bit lines are routed away from the sense amplifier in opposite directions and on one and the other side of the sense amplifier, respectively, connect a plurality of memory rows to the sense amplifier. Running in a direction perpendicular to the two bit lines are word lines which can respectively be used to open a memory cell. A drawback of the open bit line concept is that when opening a particular memory cell the word line biased for it with the activation potential only runs past one of the two mutually complementary bit lines. In this case, the word line crosses the respective bit line in a conductor track plane below this bit line. Since the distance between the word line plane and the bit line plane is usually very short, capacitive couplings arise between the word line and the bit line, as a result of which the altered word line potential additionally influences the potential on the bit line to which the opened memory cell is connected. This capacitive coupling overlies the influence of the charges in the memory cell which has been read and thus has a noise effect which occurs only on one bit line in the bit line pair. In the worst case, this parasitic capacitive coupling can corrupt the reading result. This means that signals at a sufficient level are required which need to be ensured through significantly increased capacitance of the storage capacitor, for example.

By contrast, the folded bit line concept has the advantage that both mutually complementary bit lines are arranged on the same side of the sense amplifier and therefore each word line which is activated for the purpose of reading an arbitrary memory cell connected to one of the two bit lines is crossed by both lines together. This means that capacitive couplings always arise on both bit lines. Since the capacitive couplings from a word line activated for opening are of equal magnitude on both bit lines, the potential difference to be amplified between the two bit lines is not corrupted by capacitive noise influences in this case.

The folded bit line concept is also advantageous over the open bit line concept because the latter requires a second metallization plane in order to set up conductor track bridges for connecting the complementary bit lines routed to the sense amplifier on both sides to the switching elements of the sense amplifier. However, a drawback of the folded bit line concept is that each word line is crossed by both mutually complementary bit lines together which means that besides each crossing point, at which a memory cell is arranged, there is a further crossing point on the respective other bit line, at which no memory cells are present. Hence, along the course of the conductor track of both bit lines, a memory cell is provided only at the location of every second crossing. With sufficiently large memory cells having a substrate area of 8 $F^2$ or larger (where F corresponds to the smallest lithographically produced feature size in the respective semiconductor circuit), it is admittedly possible to fill the entire substrate base area within the memory cell array with the memory cells and their reciprocal insulation without any unused substrate area remaining. However, as soon as memory cells are used which have a base area of less than 8 $F^2$, for example 4 $F^2$, unused substrate area with the size of the base area of a further memory cell or smaller remains at every second crossing, where no memory cell is provided. It is not possible to fit any additional memory cells at that point for reasons of circuitry, however, since each word line is permitted to short only one of the two mutually complementary bit lines with a capacitor from a memory cell connected thereto. This means that the folded bit line concept is disadvantageous in terms of the maximum packing density of memory cells per substrate base area as soon as memory cells with base areas of smaller than $8 F^2$ are provided.

SUMMARY OF THE INVENTION

In one aspect, the present invention provides a semiconductor memory in which two mutually complementary bit lines are respectively arranged on the same side of the sense amplifier to which they are connected and in which the packing density of memory cells along the bit line is increased. The intention is therefore to provide a semiconductor memory whose bit lines are designed on the basis of the folded bit line concept and that has an increased packing density for memory cells per substrate base area. Particular embodiments of the present invention, provide a semiconductor memory which, if memory cells with a base area of less than $8 F^2$, for example just $4 F^2$, are to be implemented, allows the greatest possible packing density for the memory cells per substrate base area and in which the greatest possible packing density for the memory cells is no longer limited by the arrangement or the course of the bit lines.

A first embodiment provides a semiconductor memory where the first bit line and the second bit line in the at least one pair of bit lines respectively have a first conductor track structure and a second conductor track structure. The memory cells are connected to the second conductor track structure of the respective bit line. The first conductor track structure of the respective bit line is interposed between the sense amplifier and the second conductor track structure of the respective bit line and is arranged at a greater distance from the substrate area than the second conductor track structure of the respective bit line. The first conductor track structures of the first bit line and of the second bit line are routed away from the sense amplifier in the same direction parallel to one another and have, at their end which is remote from the sense amplifier, an electrically conductive connection to the second conductor track structure of the respective bit line.

In line with an embodiment of the invention, provision is made for the two mutually complementary bit lines respectively to have a first and a second conductor track structure which are preferably in conductor track form, that is to say in elongate form, and the first conductor track structures of which are arranged in a different conductor track plane than the second conductor track structures. The first conductor track structures of the two complementary bit lines are routed away from the sense amplifier in the same direction in the same respective directional sense and, at their respective end which is remote from the sense amplifier, are conductively connected to the second conductor track structures arranged in the other conductor track plane. The first conductor track structures are therefore respectively interposed between the second conductor track structures and the sense amplifier. They serve as a bridge between the sense amplifier and second conductor track structures, which start further away from the sense amplifier and which have the memory cells connected to them. This opens up additional options for the circuit layout and the arrangement and packing density of the memory cells within the memory cell array. In particular, it is possible to route the two first conductor track structures away from the sense amplifier to such an extent that, from their ends, the second conductor track structures can continue not just in one direction but rather in opposite directions (back to the sense amplifier and away from it). This is not possible with the conventional folded bit line concept. The inventive semiconductor memory therefore also allows memory cells with a small substrate base area to be arranged more densely on the semiconductor substrate, since any word line only crosses the second semiconductor structure of one of the two bit lines.

Preferably, the second conductor track structure of the first bit line in the pair of bit lines runs from its end which is connected to the first conductor track structure of the first bit line in a direction back to the sense amplifier, whereas the second conductor track structure of the second bit line in the pair of bit lines, starting from its end which is connected to the first conductor track structure of the second bit line, is routed away from the sense amplifier even further than the first bit line. In line with this embodiment, the two second conductor track structures of the mutually complementary bit lines run in opposite directions. While the second conductor track structure of the first bit line runs in a direction back to the sense amplifier, the second conductor track structure of the second bit line, viewed from its junction with the first conductor track structure, extends even further away from the sense amplifier to which the second bit line is connected. In this case, the memory cells along the respective second conductor track structures can be packed as densely as desired without considering crossing points for the respective complementary bit line, since both second conductor track structures of the mutually complementary bit lines respectively cross different or other word lines. At the same time, a semiconductor memory is provided in which the two mutually complementary bit lines are connected on the same side of the sense amplifier. Furthermore, the conductor track length of the bit lines is extended on account of the interposed first conductor track structures and allows new connection concepts for the memory cell array. Particularly if the first conductor track structures do not connect any further memory cells and are used only to connect the second conductor track structures to the sense amplifier, it is possible to connect memory cells to the respective sense amplifier over greater distances than in the case of conventionally designed semiconductor memories, in which a comparable bit line length would no longer permit reliable assessment and amplification of the read signals on account of the large number of memory cells connected thereto.

Preferably, the memory cells which are connected to the second conductor track structure of the second bit line are arranged at a greater distance from the sense amplifier than the memory cells which are connected to the second conductor track structure of the first bit line. In this case, the first conductor track structure of the first bit line is used merely to ensure that the bit line capacitance of the two bit lines is of equal magnitude by connecting the second conductor track structure of the first bit line to the sense amplifier from its end which is remote from the sense amplifier. By contrast, the first conductor track structure of the second bit line is used to bridge the distance from the memory cells which are connected to the second bit line.

Preferably, the second conductor track structure of the first bit line is arranged closer to the substrate surface than the first conductor track structure of the first bit line. Viewed in a plan view of the substrate area, the first conductor track structure of the first bit line is preferably covered by the latter's second conductor track structure. This means that in a lateral direction the second conductor track structure of the first bit line has essentially the same base area and the same course as the second conductor track structure running above it, but with the opposite directional sense.

Preferably, the second conductor track structure of the second bit line is formed predominantly from a first conductor track section which is flush with the first conductor track structure of the first bit line and which runs in the opposite direction from the first conductor track structure of the first bit line. In this particularly advantageous embodiment, the memory cells which are connected to the second bit line have their physical position continually adjoining those memory cells which are connected to the first bit line. The second bit line therefore makes contact with memory cells which are arranged so as to start essentially at the point at which the first bit line (to be more precise its second conductor track structure) ends.

Preferably, the second conductor track structure of the second bit line has a second conductor track section which runs parallel to the substrate area in a different direction than the first conductor track section, the memory cells being connected to the first conductor track section. The first conductor track section connects, as already mentioned above, memory cells to one another, whereas the second conductor track section is used to allow the electrical connection to the first conductor track of the second bit line to be made in as simple a manner as possible.

Preferably, the first conductor track structures of the first bit line and of the second bit line in the pair of bit lines run next to one another and are connected to the sense amplifier next to one another. The two first conductor track structures therefore have different positions in a lateral direction perpendicular to their course, but are preferably produced in the same conductor track plane.

Preferably, the first conductor track structures of the first bit line and of the second bit line run parallel to one another, the first conductor track structure of the second bit line being longer than the first conductor track structure of the first bit line. The first conductor track structure of the second bit line may be slightly longer than that of the first bit line, particularly in order to allow the electrical connection to the second conductor track structure (arranged further away from the sense amplifier) of the second bit line to be made in the form of a simple contact hole filling. In addition, the first conductor track structure of the second bit line may have an additional conductor track section at its end which is remote from the sense amplifier, said additional conductor track section being routed, in a direction perpendicular to the course of the first conductor track structure of the first bit line, to the same position as that adopted by the first conductor track structure of the first bit line in this direction. From there, an electrical connection through a linearly designed second conductor track structure of the second bit line may be provided. This second conductor track structure of the second bit line may have arranged on it the memory cells which are connected thereto. The electrical connection provided between the two conductor track structures of the second bit line may be a contact hole filling which extends between the two conductor track planes.

Preferably, each bit line has a contact hole filling which electrically connects the first conductor track structure and the second conductor track structure of the respective bit line to one another.

In addition, provision may be made for the contact hole fillings to respectively connect the second conductor track structure to the first conductor track structure of the respective bit line in a direction perpendicular to the substrate area. The contact hole fillings may be in the form of vias.

Preferably, the contact hole filling of the second bit line is arranged on one end of the second conductor track section of the second conductor track structure of the second bit line. In this context, the second conductor track structure of the second bit line may be L-shaped overall, with the shorter limb representing the second, very short conductor track section onto which the contact hole filling of the second bit line opens.

Preferably, the second conductor track section of the second conductor track structure of the second bit line is routed from the contact hole filling, which is connected to the first conductor track structure of the second bit line, which first conductor track structure is arranged next to the first bit line, to the first conductor track section of the second conductor track structure of the second bit line, the first conductor track section being arranged flush with the second conductor track structure of the first bit line. In this context, at least the first conductor track section of the second conductor track structure of the second bit line is arranged at a point to which the second conductor track structure of the first bit line would lead if the conductor track length were extended. However, the second conductor track structure of the second bit line is connected to a first conductor track structure of the second bit line, which is arranged laterally next to the first conductor track structure of the first bit line. The electrical connection between the two substructures is made using the contact hole filling and also using the second conductor track section of the second conductor track structure of the second bit line. The former is used to bridge the vertical distance and the latter is used to bridge the lateral distance in a direction perpendicular to the course of the two bit lines.

Preferably, the second conductor track section of the second conductor track structure of the second bit line runs in a direction perpendicular to the latter's first conductor track section. In particular, the second conductor track section can bridge a lateral distance between the two bit lines which arises as a result of the first conductor track structures of the two bit lines being arranged next to one another.

Preferably, the memory cells connected to the second conductor track structure of the first bit line have the same position, in a lateral direction perpendicular to the course of the second conductor track structure of the first bit line, as the memory cells which are connected to the second conductor track structure of the second bit line. In particular, provision is made for all memory cells connected to one of the two bit lines to have the same position in this lateral direction and for this position to be the same for both bit lines.

Preferably, the first conductor track structures of the first bit line and of the second bit line are arranged laterally next to one another, whereas the second conductor track structures of the first bit line and of the second bit line are arranged flush with one another, i.e., one after the other. In this context, a semiconductor memory is proposed in which the physical relative position of the conductor track structures of the two bit lines relative to one another differs according to whether their first conductor track structures or their second conductor track structures are being considered. Whereas the first conductor track structures are connected to the sense amplifiers by running next to one another, the two second conductor track structures adjoin one another in succession in the direction of their common course (but are naturally electrically insulated from one another). The second conductor track structure of the second bit line is therefore arranged at the point at which the range of the first bit line ends.

Preferably, the second conductor track structure of the first bit line is of linear design and all the memory cells connected thereto have the same position in a lateral direction perpendicular to the course of the second conductor track structure of the first bit line. In this context, all the memory cells connected to the first bit line are lined up next to one another.

Preferably, the first conductor track structures are made of a metal or a metal alloy. In addition, provision may also be made for the second conductor track structures to be made of a metal, a metal alloy or doped polysilicon. Finally, provision may be made for the contact hole fillings to be made of a metal or a metal alloy. Examples of suitable metals or components of the metal alloy are tungsten, titanium, aluminum, copper, etc. In addition, highly doped polysilicon may be used particularly for the second conductor track structures arranged in a lower conductor track plane.

Preferably, the semiconductor memory has at least one pair of sense amplifiers which respectively have a first bit line and a second bit line connected to them, each bit line having a first conductor track structure and a second conductor track structure, where the first conductor track structures of two bit lines starting from a first sense amplifier in the pair of sense amplifiers and first conductor track structures of two bit lines starting from a second sense amplifier in the pair of sense amplifiers run toward one another and are respectively arranged flush with one another in pairs. In particular, the two bit lines connected to the first sense amplifiers and the two bit lines connected to the second sense amplifiers adopt two lateral positions in a lateral direction perpendicular to their principal direction of extent, and respective first conductor track structures of two respective instances of the four bit lines run toward one another and are arranged flush with one another.

Preferably, the first conductor track structure of the first bit line, which starts from the first sense amplifier, and the first conductor track structure of the second bit line, which starts from the second sense amplifier, run toward one another flush with one another. The two conductor track structures therefore run along the same axis, that is to say are arranged flush with one another. In the case of both bit line pairs, that bit line which is used for connecting memory cells which are arranged closer to the respective sense amplifier than those memory cells which are connected to the other bit line in the same bit line pair is respectively called the first bit line in this case. The second bit line in a bit line pair therefore denotes that bit line which connects the memory cells which are arranged further away.

Preferably, the second conductor track structure of the second bit line, which starts from the first sense amplifier, and the first conductor track structure of the first bit line, which starts from the second sense amplifier, are arranged flush with one another.

Preferably, the first conductor track section of the second conductor track structure of the second bit line, which is connected to the first sense amplifier, runs in a lateral direction centrally below the first conductor track structure of the second bit line, which is connected to the second sense amplifier. Hence, seen in a plan view of the substrate area, the first conductor track structure of the second bit line, which is connected to the second sense amplifier, covers the second conductor track structure (or at least the first conductor track section thereof) of the second bit line, which is connected to the first sense amplifier.

Another preference is that a first conductor track section of the second conductor track structure of the second bit line, which is connected to the second sense amplifier, runs in a lateral direction centrally below the first conductor track structure of the second bit line, which is connected to the first sense amplifier.

Preferably, the first conductor track section of the second conductor track structure of the second bit line, which is connected to the first sense amplifier, runs toward the second sense amplifier, and the first conductor track section of the second conductor track structure of the second bit line, which is connected to the second sense amplifier, runs toward the first sense amplifier. Hence, the second conductor track structures of the second bit lines are respectively connected close to that sense amplifier which does not currently have the relevant bit line connected to it. This interacting arrangement and meshing of bit lines allows a more flexible layout for the course of the bit lines.

In particular, provision is preferably made for the second conductor track structure of the second bit line, which is connected to the first sense amplifier, to run, over a predominant section of its conductor track length, below the first conductor track structure of the second bit line, which is connected to the second sense amplifier, but at the same time also next to the second conductor track structure of the first bit line, which is connected to the second sense amplifier.

Provision is also preferably made for the second conductor track structure of the second bit line, which is connected to the second sense amplifier, to run, over a predominant section of its conductor track length, below the first conductor track structure of the second bit line, which is connected to the first sense amplifier, but at the same time next to the second conductor track structure of the first bit line, which is connected to the first sense amplifier. In line with these two embodiments, the second conductor track structures of the respective second bit line, which respectively run in the direction of the other sense amplifier, are covered by a first conductor track structure of the other bit line pair and at the same time run parallel next to a second conductor track structure of this other bit line pair.

Preferably, the second conductor track structures of the first bit lines, which are connected to the first sense amplifier and to the second sense amplifier in the pair of sense amplifiers, run toward the respective sense amplifier. Thus, the first conductor track structures of the respective first bit line are routed back to the sense amplifier to which their end remote from this sense amplifier is connected.

Preferably, the bit lines connected to the first sense amplifier and the bit lines connected to the second sense amplifier engage one another.

Preferably, the sense amplifiers are designed such that when reading memory cells they amplify a potential difference between a potential on the first bit line and a potential on the second bit line, which are connected to the respective sense amplifier. In this case, after the sensing phase the potential difference between the two initial bit line potentials is amplified and then applied to the bit lines, which spreads the bit line potentials, i.e., amplifies their potential difference. During this, the polarity or arithmetic sign of the potential difference is maintained.

Preferably, the semiconductor memory has a multiplicity of pairs of sense amplifiers whose bit lines engage in one anther.

Preferably, the memory cells are volatile memory cells which respectively have a selection transistor and a storage capacitor. The storage capacitor may be a trench capacitor or a stack capacitor. The semiconductor memory is preferably a dynamic read/write memory.

Preferably, the semiconductor memory also has a further pair of bit lines with a third bit line and a fourth bit line, which are connected to the same sense amplifier as the first pair of bit lines, where the third bit line and the fourth bit line are arranged on the opposite side of the sense amplifier from the first bit line and the second bit line, and where the sense amplifier selectively amplifies a potential difference between a potential on the first bit line and a potential on the second bit line or a potential difference between a potential on the third bit line and a potential on the fourth bit line.

It is therefore possible for more than one pair of bit lines to be connected to the sense amplifier, with the sense amplifier being able to be electrically connected selectively to the one or the other bit line pair. In particular, a further pair of bit lines may be connected to the same sense amplifier, the further pair of bit lines and the first pair of bit lines being connected to opposite sides of the same sense amplifier.

Preferably, the (first) pair of bit lines and the second, further pair of bit lines are respectively connected to the sense amplifier via a selection device, the selection devices being able to connect the sense amplifier selectively to the first pair of bit lines or to the further pair of bit lines. By way of example, the selection devices may be in the form of a multiplexer which selectively connects the first or the second pair of bit lines to the sense amplifier. The respective other pair of bit lines is then electrically decoupled from the sense amplifier intermittently.

Preferably, the third bit line and the fourth bit line respectively have a first conductor track structure and a second conductor track structure, where the second conductor track structures connect further memory cells, and where the first conductor track structures are interposed between the second conductor track structures and the sense amplifier. Preferably, the third bit line and the fourth bit line are of similar design to the first bit line and the second bit line. In particular, the first conductor track structures of the third bit line and of the fourth bit line are preferably arranged in a conductor track plane which is arranged at a greater distance from the substrate area than the conductor track plane in which the first conductor track structures of the third bit line and of the fourth bit line are connected. The geometrical shape of the third and fourth bit lines may be such that by rotating them through 180 degrees around the solder running through the sense amplifier relative to the substrate area they come from the first and second bit lines. It is thus possible for the second conductor track structure of the third bit line to return in the direction of the sense amplifier again, whereas the second conductor track structure of the fourth bit line extends in a direction away from the sense amplifier but in the opposite direction from the second conductor track structure of the second bit line.

Preferably, the third bit line and the fourth bit line respectively have a contact hole filling which connects the second conductor track structures to the first conductor track structures.

Finally, provision may be made for the third bit line and the fourth bit line, which are connected to the first sense amplifier to be designed and oriented in the same way as the first bit line and the second bit line in the pair of bit lines, which is connected to the second sense amplifier. In this way, a periodic arrangement of sense amplifiers with pairs of bit lines which are arranged in between them and which respectively engage in one another may be provided over a certain subregion of the memory cell array.

BRIEF DESCRIPTION OF THE DRAWINGS

The invention is described below with reference to the figures, in which.

DETAILED DESCRIPTION OF ILLUSTRATIVE EMBODIMENTS

Figure 1:
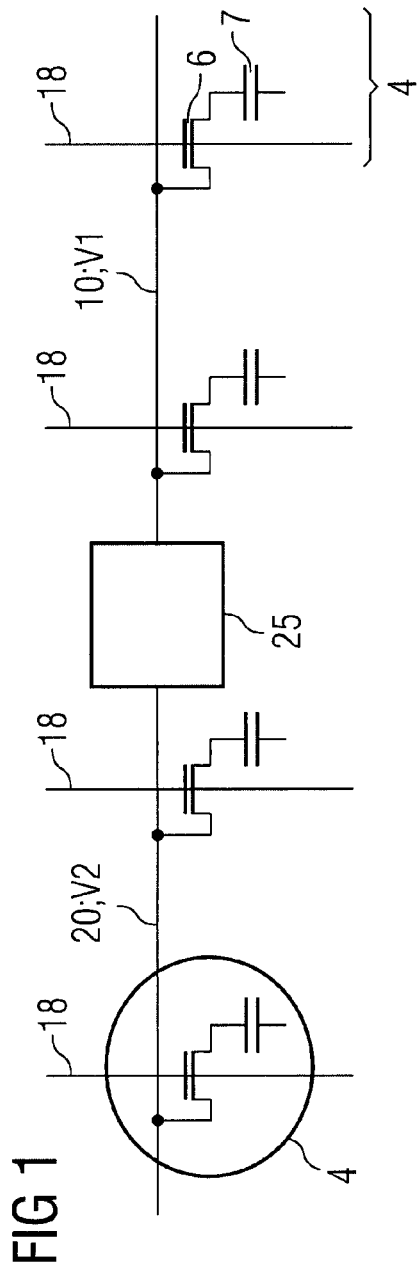
FIG. 1 shows a schematic view of a detail from a conventional semiconductor memory based on the open bit line concept.

FIG. 1 schematically shows a detail from a conventional semiconductor memory based on the open bit line concept, particularly the arrangement and connection of bit lines. Two respective bit lines 10, 20 in a pair of bit lines are connected to the same sense amplifier 25, which is used to compare the electrical potentials of the two bit lines 10, 20 with one another and to amplify a potential difference and to write it back to the bit lines in amplified form. Each bit line 10, 20 has a multiplicity of bit-line-end source/drain electrodes of selection transistors 6 from memory cells 4. In the case of a DRAM, the memory cells 4 comprise a storage capacitor 7 in addition to the selection transistor 6. On the basis of the open bit line concept, the two bit lines 10, 20, whose potentials V1, V2 are spread relative to one another by the sense amplifier 25, are arranged on opposite sides of the sense amplifier 25. Accordingly, the second bit line 20 in the pair of bit lines 10, 20 crosses different word lines 18 than the first bit line 10. Capacitive couplings which arise when a word line 18, to which a memory cell which is to be read is connected, is activated therefore affect only one of the bit lines 10, 20 and alter its potential.

By contrast, the folded bit line concept has both bit lines arranged on the same side of the sense amplifier 25 and therefore crossing the same respective word lines.

With both concepts for arranging and connecting the bit lines, the range of the bit line is limited, since as the conductor track length or distance from the sense amplifier 25 at each circuit node, i.e., junction between a memory cell and the bit line, increases, the bit line capacitance increases. Since, when a memory cell is read, the electrical charge previously stored in the storage capacitor is distributed over the entire bit line, including the open storage capacitor, a large bit line capacitance attenuates the potential difference produced during reading. It is therefore conventionally possible to actuate only memory cells which are arranged at a distance from the sense amplifier which corresponds to the maximum permissible bit line length which still permits sufficiently reliable recognition of the information read from the memory cell. This is because the longer a bit line, the more memory cells are conventionally connected to it.

In semiconductor memories based on the folded bit line concept, the problem also arises that with memory cells that are of particularly small substrate base area a substantial portion of the substrate area of the memory cell array remains unused because it is not possible to provide a selection transistor or a memory cell at every point at which a bit line crosses a word line. Normally, a memory cell is provided only at every second crossing point, which means that a bit line crosses twice as many word lines as there are memory cells connected to the bit line. Conventionally, the substrate area at the location of the crossing points at which there are no selection transistors arranged can still be used for the storage capacitors of the remaining memory cells. Particularly with memory cells which have a base area of 8 $F^2$ (with F as the minimum feature size) or larger, the remaining substrate area can be used for the capacitors. In the case of memory cells which have a substrate area smaller than 8 $F^2$, however, there remains within the memory cell array unused substrate area that is larger, the smaller the memory cells. The reason for it not being possible to use the further substrate area is that a memory cell is provided along the course of the bit line only at every second point at which it crosses a word line, and hence the next memory cell cannot occur until after at least one memory cell occurs on the complementary bit line in the parallel conductor track section.

Figure 2:
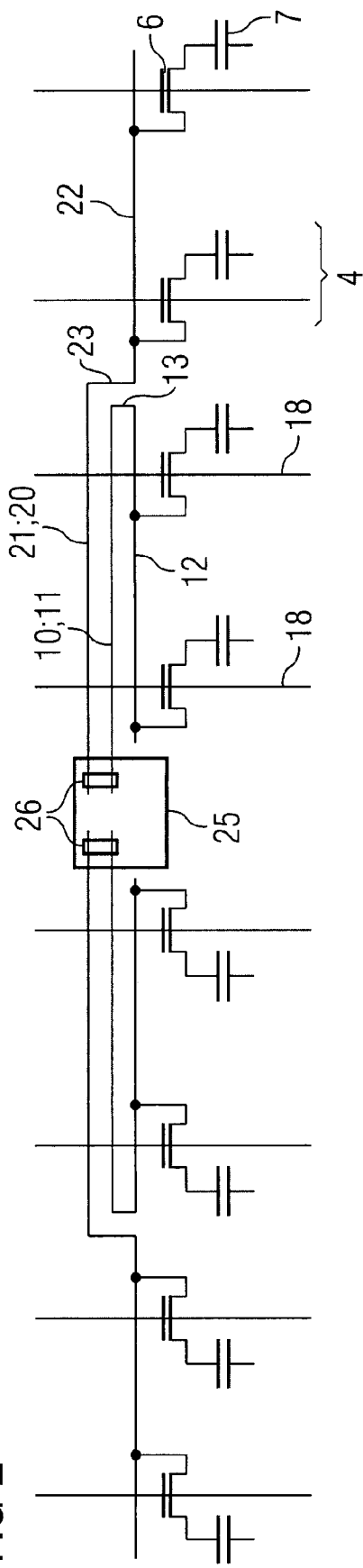
FIG. 2 shows a schematic view of a detail from an inventive semiconductor memory including a development of the invention.

FIG. 2 shows a schematic view of a detail from an inventive semiconductor memory based on a development of the invention. With the invention (at least) one side of the sense amplifier 25 is provided with a pair of bit lines 10, 20 whose potentials are spread via the sense amplifier 25 and which are therefore the complement of one another. In line with the development, the left-hand side of the sense amplifier 25 is also provided with a corresponding pair of bit lines which are arranged as a mirror image of the pair of bit lines 10, 20 and which will therefore not be discussed in more detail below. As already indicated in the schematic view of FIG. 2, the two bit lines 10, 20 respectively comprise conductor track structures which run in two different conductor track planes, namely in a lower conductor track plane and in an upper conductor track plane, the latter being arranged at a greater distance from the substrate area than the lower conductor track plane. The upper conductor track plane contains respective first conductor track structures 11, 21 of the bit lines 10, 20; these are preferably made from a metal or a metal alloy and serve merely to bridge a distance from ends of second conductor track structures 12, 22, which are arranged in the first conductor track plane and respectively connect a multiplicity of memory cells 4. The electrical connection between the first and second conductor track structures of the respective bit line is made using contact hole fillings 13, 23. As can already be seen from FIG. 2, the inventive arrangement and design of bit lines can be used to bridge greater distances from a sense amplifier 25 with bit lines 10, 20 within which memory cells are arranged and can be connected to the sense amplifier without, as in the case of conventional semiconductor memories, an inadmissibly high number of memory cells per bit line making it difficult to recognize the read cell signals reliably. In particular, FIG. 2 already reveals that the second conductor track structure 12 of the first bit line 10 returns from that end of the first conductor track structure 11 which is remote from the sense amplifier 25 back in the direction of the sense amplifier 25, whereas the second conductor track structure 22 of the second bit line 20 is used to connect memory cells in a region which is situated outside of the range of the first bit line and which would therefore conventionally be able to be actuated on the same sense amplifier. The inventive arrangement allows sense amplifiers to be arranged at greater distances from one another and/or memory cells to be connected to the sense amplifiers over greater distances without impairing the read quality.

Figure 3:
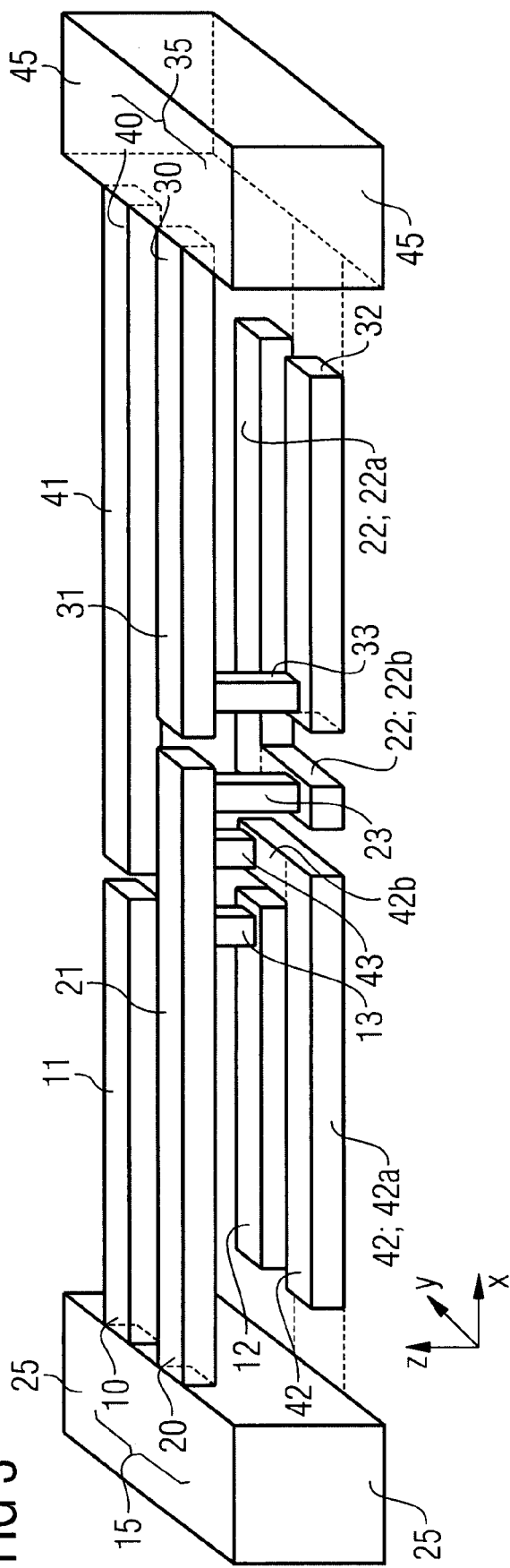
FIG. 3 shows a perspective view of a detail from an inventive semiconductor memory.

FIG. 3 shows a perspective view of a detail from the inventive semiconductor memory in which, in a similar way to in the folded bit line concept, both bit lines 10, 20 in a pair 15 of bit lines are arranged on the same side of the sense amplifier 25 and run parallel to one another in the same directional sense. In line with the invention, this applies at least to the first conductor track structures 11, 21, whose longitudinal extent, like that of the further conductor track structures, is shown in shortened form for the sake of clarity. Nevertheless, the first conductor track structure 21 of the second bit line 20 may be slightly longer than the first conductor track structure 11 of the first bit line 10 in order to allow the electrical connection to the second conductor track structure 22 of the second bit line 20 to be in as simple a form as possible in the center between two sense amplifiers 25, 45. Whereas, as in FIG. 2, the lower, second conductor track structure 12 of the first bit line 10 is routed in the direction back to the sense amplifier 25 again, the second conductor track structure 22 of the second bit line 20 extends in a direction away from the sense amplifier 25. In its predominant conductor track section, the first conductor track section 22a is arranged in inverse parallel with the second conductor track structure 12 of the first bit line 10 and is preferably arranged flush with the latter. If one were to imagine extending the two conductor track regions 12, 22, a single conductor track would therefore be produced. Nevertheless, the second conductor track structures 12, 22 of the two bit lines 10, 20 are naturally electrically isolated from one another. In particular, the two second conductor track structures 12, 22 are arranged in a lower, first conductor track plane, whereas the first conductor track structures 11, 21 are arranged in a second, higher conductor track plane. The vertical distances between the first and second conductor track structures are bridged by appropriate contact hole fillings 13, 23. What are not graphically shown in FIG. 3 are the memory cells, a respective multiplicity of which, are connected to the second conductor track structures 12, 22. In addition to the first conductor track section 22a, the second conductor track structure 22 of the second bit line may also have a second, much shorter conductor track section 22b which is used primarily to bridge a lateral distance in a direction y perpendicular to the course of the first conductor track section 22a. This second conductor track section 22b can have the contact hole filling 23 of the first bit line opening onto it. The memory cells connected to the bit line pair 15 are connected particularly to the second conductor track structures 12, 22 of these bit lines.

The second conductor track structure 22 of the second bit line 20, moving further away from the sense amplifier 25, not only increases the range of the bit lines which can be read reliably by the sense amplifier 25 but also creates space for a second conductor track structure 42, coming from the right in FIG. 3, of a bit line 40 which is connected to a further sense amplifier 45. Accordingly, FIG. 3 simultaneously also shows a development of the invention in which respective pairs of sense amplifiers 25, 45 are arranged whose bit line pairs 15, 35 engage in one another. The first and second bit lines 30, 40 of the bit line pair 35 connected to the second sense amplifier 45 are designed in similar fashion to the bit lines 10, 20 in the bit line pair 15 connected to the first sense amplifier 25, but twisted through 180° about the normal to the substrate surface, which is represented by the two lateral directions x and y. Situated in the center between the two sense amplifiers 25, 45 are the respective contact hole fillings 13, 23 and 33, 43 which connect the first conductor track structures 11, 21, 31, 41 to the second conductor track structures 12, 22, 32, 42. In the lower conductor track plane, the second conductor track structures 12, 22, which are respectively shown at the back in FIG. 3, are actuated by the first sense amplifier 25, whereas the second conductor track structures 32, 42, which are shown at the front in FIG. 3, are actuated by the second sense amplifier 45.

Figure 4:
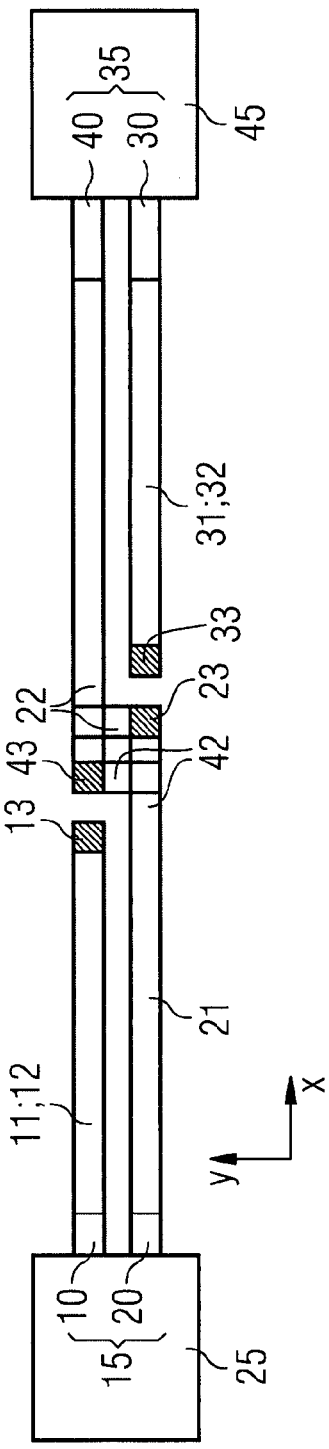
FIG. 4 shows a schematic plan view of the detail from the inventive semiconductor memory shown in FIG. 3.

FIG. 4 shows a plan view of the detail from an inventive semiconductor memory which is shown in FIG. 3. The engagement of the bit line pairs 15, 35 in one another can be seen directly in the plan view. The conductor track structures 11, 12, 21, 22 of the bit line pair 15 connected to the first sense amplifier 25 are individually provided with reference symbols. However, the other reference symbols (not expressly indicated) of some conductor track structures which are hidden in the plan view in FIG. 4 can be seen in FIG. 3. FIG. 4 shows more clearly than FIG. 3 that the second conductor track structures 12, 22 of the two bit lines 10, 20 connected to the first sense amplifier 25 connect memory cells which not only have the same lateral position in the y direction perpendicular to the conductor track course within the respective second conductor track structure 12, 22, but also have the same position relative to one another in the case of both second conductor track structures 12, 22 in the y direction.

Figure 5:
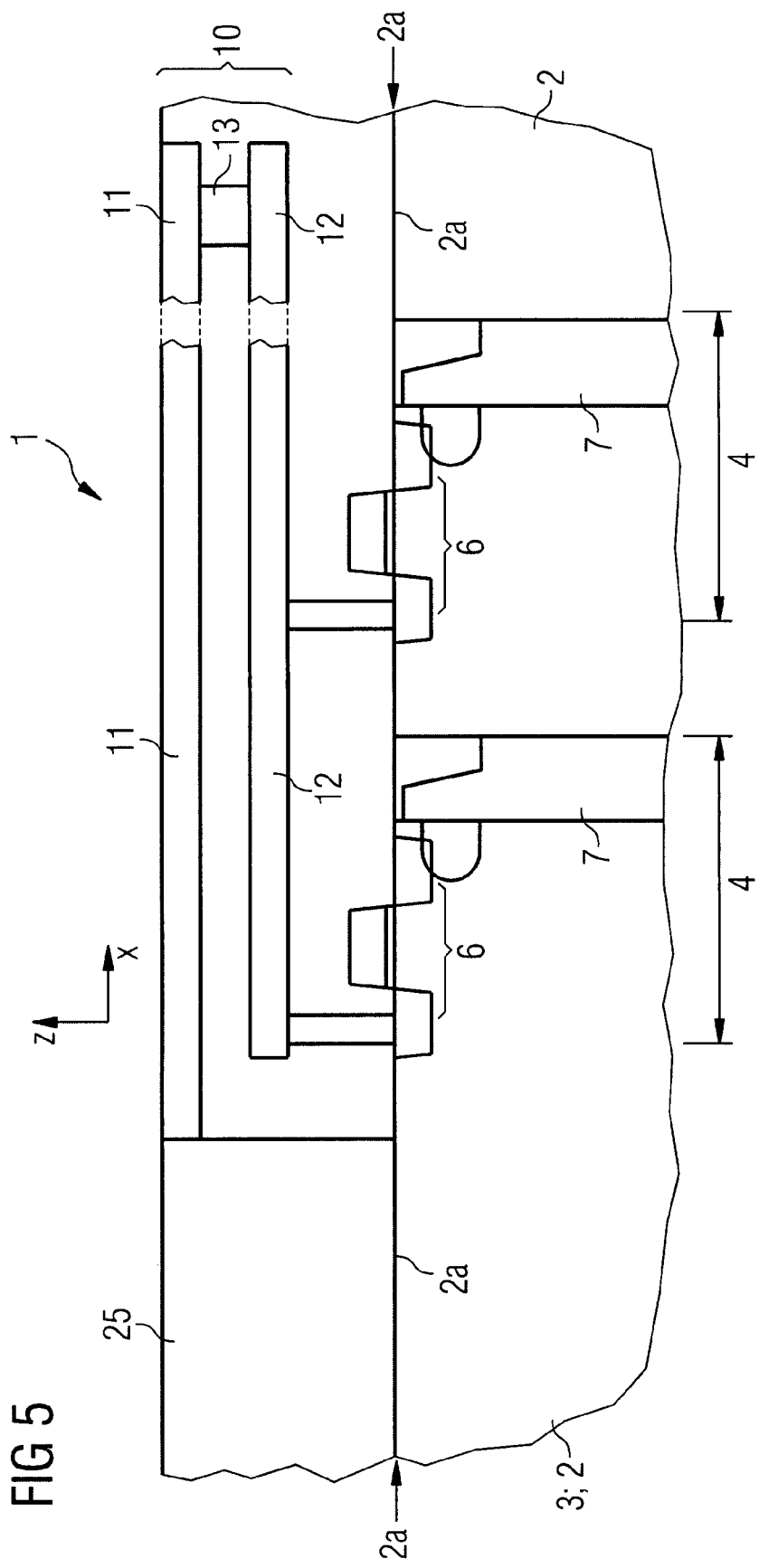
FIG. 5 shows a schematic cross sectional view for the semiconductor memory shown in FIGS. 3 and 4.

FIG. 5 shows a schematic cross sectional view of a detail from the semiconductor memory in FIGS. 3 and 4. Above a substrate 2, in which a multiplicity of memory cells containing selection transistors 6 and storage capacitors 7, for example trench capacitors, are formed, it is possible to see, in schematic form, the cross section through at least the first bit line 10, which is connected to a sense amplifier 25. The bit line 10 has a first conductor track structure 11, a second conductor track structure 12 and a contact hole filling 13 which connects the two conductor track structures to one another. Both the first and the second conductor track structures are in conductor track form, that is to say of elongate design. The memory cells 4 are connected exclusively to the second conductor track structure 12 of the bit line 10. For the sake of clarity, FIG. 5 shows just two memory cells 4 (which each have a selection transistor 6 and a storage capacitor 7). A bit-line-end source/drain region of the selection transistor, for example produced using a MOSFET design (Metal Oxide Semiconductor Field Effect Transistor), is connected to the second conductor track structure 12 of the bit line 10 via a bit line contact, whereas the capacitor-end source/drain region overlaps a diffusion from the capacitor trench and thus makes the electrical connection to an inner capacitor electrode. The inner capacitor electrode is isolated from an outer capacitor electrode by a capacitor dielectric (not shown in FIG. 5) which covers the trench bottom and the trench walls from the inside.

As can be seen in FIG. 5, the two conductor track structures 11, 12 of the bit line 10 run in two different conductor track planes above one another, these respectively being arranged above the substrate area 2a. The second conductor track structure 12 is at a shorter distance from the substrate area 2a than the first conductor track structure 11. In addition, it can be seen in FIG. 5 that the first conductor track structure 11 is routed away from the sense amplifier 25 and is not connected to one end of the second conductor track structure 12 via the contact hole filling 13 until at its end which is remote from the sense amplifier 25, that is to say on the right in FIG. 5. The second conductor track structure 12 is routed from there back in the direction of the sense amplifier 25 again and is connected in this route to the memory cells 4 which are connected to the bit line 10.

The second bit line 20, which is likewise connected to the sense amplifier 25 and is used as a bit line which is the complement of the bit line 10, is not shown in FIG. 5; its first conductor track structure 21 runs parallel to the conductor track structure 11 of the first bit line 10 above or below the plane of the drawing. the second conductor track structure 22 of the second bit line 20, which likewise connects a multiplicity of memory cells 4, would run to the right of the picture section shown in FIG. 5 and would connect memory cells arranged further away from the sense amplifier 25 to said sense amplifier.

Figure 6:
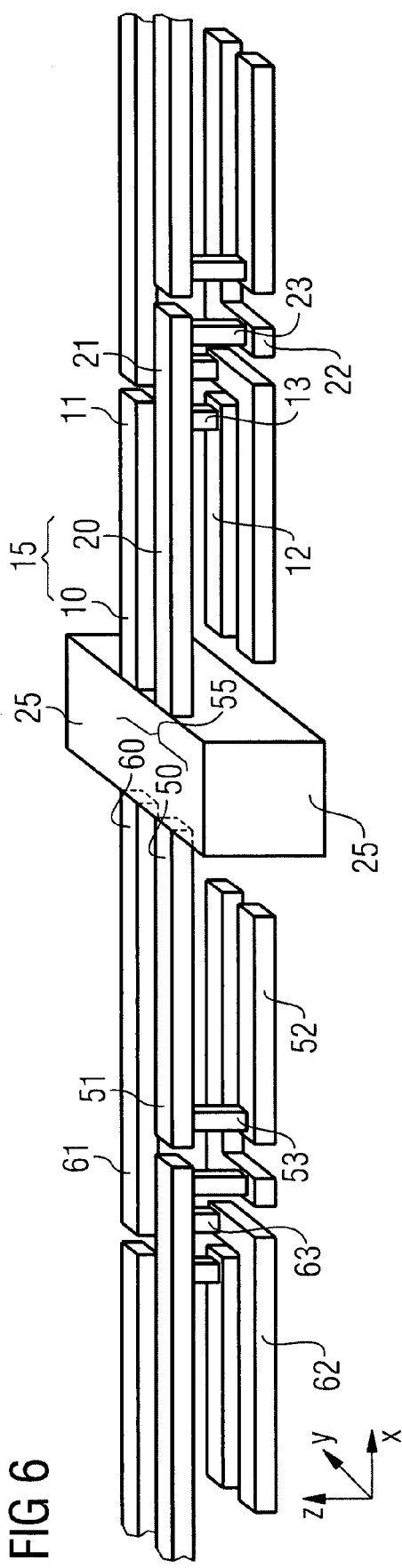
FIG. 6 shows a perspective view of an inventive semiconductor memory based on the development shown in FIG. 2.

FIG. 6 shows a schematic cross sectional view of a development of the invention in which, as already indicated in FIG. 2, two different pairs 15, 55 of bit lines 10, 20 and 50, 60 are connected to the same respective sense amplifier 25. Each of these pairs 15, 55 of bit lines is designed such that it engages with a further pair of bit lines, which is connected to a respective subsequent sense amplifier (not depicted in FIG. 6). The further pair 55 of bit lines 50, 60, connected to the sense amplifier 25, contains bit lines which are arranged on the opposite side of the sense amplifier 25 from the first pair 15 of bit lines; the bit lines 50, 60 are used to connect memory cells on the opposite side of the sense amplifier 25. The third and fourth bit lines 50, 60 likewise have first 51, 61 and second conductor track structures 52, 62, which are preferably connected to one another by contact hole fillings 53, 63. Preferably, the second conductor track structure 52 of the third bit line 50 runs back in the direction of the sense amplifier 25, whereas the second conductor track structure 62 of the fourth bit line 60 runs in the direction away from the sense amplifier 25. The two conductor track structures 52, 62 are preferably arranged flush with one another and therefore likewise serve to connect memory cells which have the same position in a direction perpendicular to the common conductor track course, that is to say in the lateral y direction.

Figure 7:
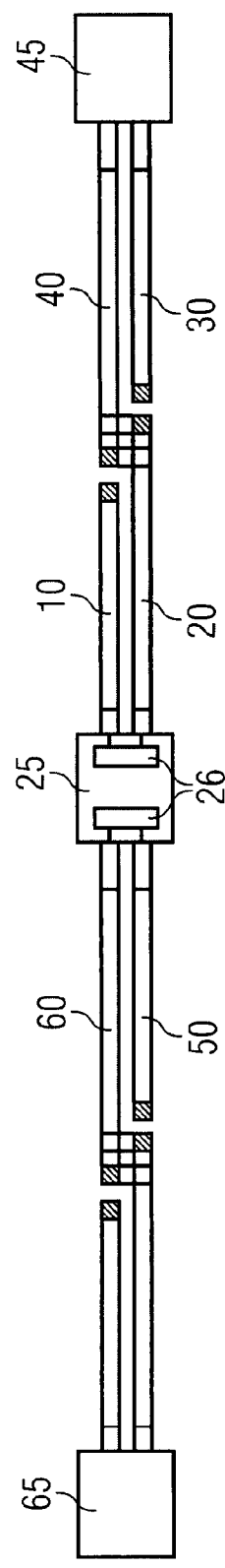
FIG. 7 shows a plan view of the semiconductor memory shown in FIG. 6.

FIG. 7 shows a schematic plan view of the semiconductor memory shown in FIG. 6. It can be seen that the first pair of bit lines 10, 20 and the further pair of bit lines 50, 60 are routed away from the sense amplifier 25 in opposite directions, namely in the negative and positive x directions, and respectively connect to different groups of memory cells (not shown in FIG. 7), with the first and third bit lines 10, 50 respectively connecting memory cells which are arranged closer to the sense amplifier 25, and the second and fourth bit lines 20, 40 connecting bit lines which are arranged further away. Both pairs of bit lines 10, 20 and 50, 60 engage with a further pair of bit lines, which are connected to a second sense amplifier 45 and to a third sense amplifier 65. The semiconductor memory may have, within the sense amplifier 25 (or interposed between the sense amplifier 25 and a respective pair of bit lines 10, 20 or 50, 60), a selection device 26 which is used to connect the sense amplifier selectively to one of the two pairs 15, 55 (FIG. 6) of bit lines 10, 20 or 50, 60. Depending on the setting of the selection device 26, the sense amplifier 25 may thus either (at a particular time) read a potential difference between the first bit line 10 and the second bit line 20 and write it back in amplified form or (at another time) read a potential difference between the third bit line 50 and the fourth bit line 60 and write it back in amplified form.

Figure 8:
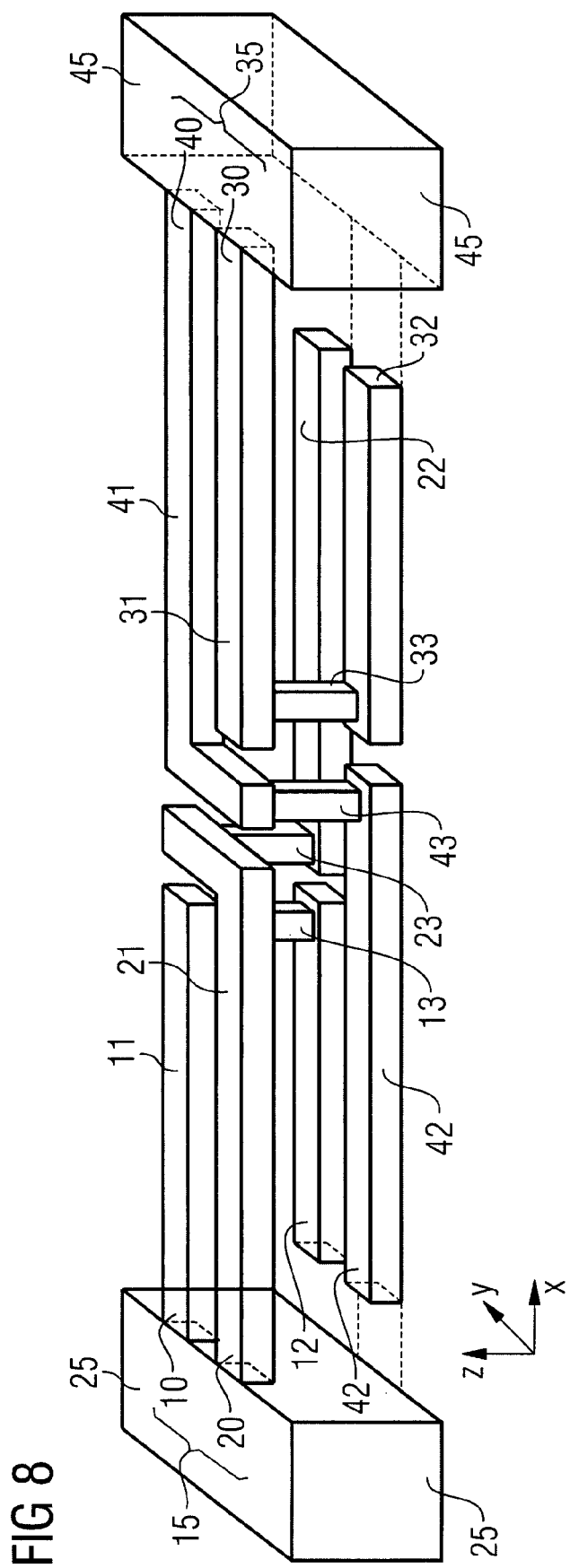
FIG. 8 shows a perspective view of a detail from an alternative embodiment of an inventive semiconductor memory from in FIG. 3.

FIG. 8 shows a perspective view of a detail from an inventive semiconductor memory based on another embodiment, alternative to FIG. 3. Unlike in FIG. 3, the first conductor track structure 21 of the second bit line 20 has not only a first, rectilinear conductor track section but also a second conductor track section which runs in a different direction than the first conductor track section and, like the conductor track section 22b in FIG. 3, bridges a lateral distance in the y direction. The second conductor track structure 22 of the second bit line may therefore be in rectilinear form in FIG. 8. Similarly, the conductor track structure 42 in FIG. 8 is of rectilinear design and the conductor track structure 41 is L-shaped.

The inventive arrangement and form of bit lines on a semiconductor memory allows more versatile and more flexible connection of the memory cells in a memory cell array to the sense amplifiers. In particular, memory cells which, in view of bit line lengths which can conventionally be actuated reliably, are actually arranged outside of the range of the sense amplifiers are for the first time connected up to the sense amplifiers via the bit lines designed in line with the invention and are operated reliably without the bit line length or the number of memory cells per bit line resulting in reading inaccuracies or reading errors when the memory cells are read.

What is claimed is:

1. An integrated semiconductor memory comprising:
   a substrate with a substrate area and with a memory cell array;
   a multiplicity of memory cells disposed in the memory cell area;
   at least one pair of bit lines which comprises a first bit line and a second bit line, where the first bit line and the second bit line respectively have a plurality of memory cells coupled to them;
   at least one sense amplifier to which the first bit line and the second bit line in the pair of bit lines are coupled;
   wherein the first bit line and the second bit line in the at least one pair of bit lines respectively each have a first conductor track structure and a second conductor track structure;
   wherein the memory cells are connected to the second conductor track structure of the respective bit line;
   wherein the first conductor track structure of the respective bit line is interposed between the sense amplifier and the second conductor track structure of the respective bit line and is arranged at a greater distance from the substrate area than the second conductor track structure of the respective bit line;
   wherein the first conductor track structures of the first bit line and of the second bit line are routed away from the sense amplifier in the same direction parallel to one another and have, at an end that is remote from the sense amplifier, an electrically conductive connection to the second conductor track structure of the respective bit line; and
   wherein the second conductor track structure of the first bit line in the pair of bit lines runs from its end which is connected to the first conductor track structure of the first bit line in a direction back to the sense amplifier, whereas the second conductor track structure of the second bit line in the same pair of bit lines, starting from its end which is connected to the first conductor track structure of the second bit line, is routed away from the sense amplifier even further than the first bit line.

2. The semiconductor memory as claimed in claim 1, wherein the memory cells that are connected to the second conductor track structure of the second bit line are arranged at a greater distance from the sense amplifier than the memory cells that are connected to the second conductor track structure of the first bit line.

3. A semiconductor memory comprising:
   a substrate with a substrate area and with a memory cell array;
   a multiplicity of memory cells disposed in the memory cell area;
   at least one pair of bit lines which comprises a first bit line and a second bit line, where the first bit line and the second bit line respectively have a plurality of memory cells coupled to them;
   at least one sense amplifier to which the first bit line and the second bit line in the pair of bit lines are coupled;
   wherein the first bit line and the second bit line in the at least one pair of bit lines respectively each have a first conductor track structure and a second conductor track structure;
   wherein the memory cells are connected to the second conductor track structure of the respective bit line;
   wherein the first conductor track structure of the respective bit line is interposed between the sense amplifier and the second conductor track structure of the respective bit line and is arranged at a greater distance from the substrate area than the second conductor track structure of the respective bit line;
   wherein the first conductor track structures of the first bit line and of the second bit line are routed away from the sense amplifier in the same direction parallel to one another and have, at an end that is remote from the sense amplifier, an electrically conductive connection to the second conductor track structure of the respective bit line; and
   wherein the second conductor track structure of the second bit line is formed predominantly from a first conductor track section that is flush with the first conductor track structure of the first bit line and that runs in the opposite direction from the first conductor track structure of the first bit line.

4. The semiconductor memory as claimed in claim 3, wherein the second conductor track structure of the second bit line has a second conductor track section that runs in a different direction than the first conductor track section parallel to the substrate area, the memory cells being connected to the first conductor track section of the second conductor track structure of the second bit line.

5. The semiconductor memory as claimed in claim 1, wherein the first conductor track structures of the first bit line and of the second bit line in the pair of bit lines run next to one another and are connected to the sense amplifier next to one another.

6. The semiconductor memory as claimed in claim 1, wherein the first conductor track structures of the first bit line and of the second bit line run parallel to one another, the first conductor track structure of the second bit line being longer than the first conductor track structure of the first bit line.

7. The semiconductor memory as claimed in claim 1, wherein each bit line has a contact hole filling that electrically connects the first conductor track structure and the second conductor track structure of the respective bit line to one another.

8. The semiconductor memory as claimed in claim 7, wherein the contact hole fillings respectively connect the second conductor track structure to the first conductor track structure of the respective bit line in a direction perpendicular to the substrate area.

9. The semiconductor memory as claimed in claim 7, wherein the contact hole filling of the second bit line is arranged on one end of a second conductor track section of the second conductor track structure of the second bit line, the second conductor track structure of the second bit line having a first conductor track section.

10. The semiconductor memory as claimed in claim 7, wherein a second conductor track section of the second conductor track structure of the second bit line is routed from the contact hole filling, which is connected to the first conductor track structure of the second bit line, which first conductor track structure is arranged next to the first bit line, to a first conductor track section of the second conductor track structure of the second bit line, the first conductor track section being arranged flush with the second conductor track structure of the first bit line.

11. The semiconductor memory as claimed in claim 4, wherein the second conductor track section of the second conductor track structure of the second bit line runs in a direction perpendicular to the course of the first conductor track section.

12. The semiconductor memory as claimed in claim 1, wherein the memory cells connected to the second conductor track structure of the first bit line have the same position, in a lateral direction perpendicular to the course of the second conductor track structure of the first bit line, as the memory cells that are connected to the second conductor track structure of the second bit line.

13. The semiconductor memory as claimed in claim 1, wherein the first conductor track structures of the first bit line and of the second bit line are arranged next to one another in a lateral direction, whereas the second conductor track structures of the first bit line and of the second bit line are arranged flush with one another.

14. The semiconductor memory as claimed in claim 13, wherein the second conductor track structure of the first bit line is of linear design and all the memory cells connected thereto have the same position in a lateral direction perpendicular to the course of the second conductor track structure of the first bit line.

15. The semiconductor memory as claimed in claim 1, wherein all the memory cells connected to the second bit line are connected to a linear first conductor track section of the second conductor track structure of the second bit line and have the same position in a lateral direction perpendicular to the course of said first conductor track section.

16. The semiconductor memory as claimed in claim 1, wherein the first conductor track structures are made of a metal or a metal alloy.

17. The semiconductor memory as claimed in claim 16, wherein the second conductor track structures are made of a metal, a metal alloy or doped polysilicon.

18. The semiconductor memory as claimed in claim 1, wherein the semiconductor memory has at least one pair of sense amplifiers which respectively have a first bit line and a second bit line connected to them, each bit line having a first conductor track structure and a second conductor track structure, where the first conductor track structures of two bit lines starting from a first sense amplifier in the pair of sense amplifiers and first conductor track structures of two bit lines starting from a second sense amplifier in the pair of sense amplifiers run toward one another and are respectively arranged flush with one another in pairs.

19. The semiconductor memory as claimed in claim 18, wherein the first conductor track structure of the first bit line, which starts from the first sense amplifier, and the first conductor track structure of the second bit line, which starts from the second sense amplifier, run toward one another flush with one another.

20. The semiconductor memory as claimed in claim 18, wherein the first conductor track structure of the second bit line, which starts from the first sense amplifier, and the first conductor track structure of the first bit line, which starts from the second sense amplifier, run toward one another flush with one another.

21. The semiconductor memory as claimed in claim 18, wherein the first conductor track section of the second conductor track structure of the second bit line, which is connected to the first sense amplifier, runs in a lateral direction centrally below the first conductor track structure of the second bit line, which is connected to the second sense amplifier.

22. The semiconductor memory as claimed in claim 18, wherein a first conductor track section of the second conductor track structure of the second bit line, which is connected to the second sense amplifier, runs in a lateral direction centrally below the first conductor track structure of the second bit line, which is connected to the first sense amplifier.

23. The semiconductor memory as claimed in claim 21, wherein the first conductor track section of the second conductor track structure of the second bit line, which is connected to the first sense amplifier, runs toward the second sense amplifier, and wherein the first conductor track section of the second conductor track structure of the second bit line, which is connected to the second sense amplifier, runs toward the first sense amplifier.

24. The semiconductor memory as claimed in claim 18, wherein the second conductor track structure of the second bit line, which is connected to the first sense amplifier, runs, over a predominant section of its conductor track length, below the first conductor track structure of the second bit line, which is connected to the second sense amplifier, and next to the second conductor track structure of the first bit line, which is connected to the second sense amplifier.

25. The semiconductor memory as claimed in claim 18, wherein the second conductor track structure of the second bit line, which is connected to the second sense amplifier, runs, over a predominant section of its conductor track length, below the first conductor track structure of the second bit line, which is connected to the first sense amplifier, and next to the second conductor track structure of the first bit line, which is connected to the first sense amplifier.

26. The semiconductor memory as claimed in claim 18, wherein the second conductor track structures of the first bit lines, which are connected to the first sense amplifier and to the second sense amplifier in the pair of sense amplifiers, run back toward the respective sense amplifier.

27. The semiconductor memory as claimed in claim 18, wherein the bit lines connected to the first sense amplifier and the bit lines connected to the second sense amplifier engage in one another.

28. The semiconductor memory as claimed in claim 18, wherein each sense amplifier is designed such that when reading a memory cell it amplifies a potential difference between a potential on the first bit line and a potential on the second bit line, which is connected to the respective sense amplifier.

29. The semiconductor memory as claimed in claim 1, wherein the semiconductor memory has a multiplicity of pairs of sense amplifiers whose bit lines engage in one another.

30. The semiconductor memory as claimed in claim 1, wherein the memory cells are volatile memory cells which respectively have a selection transistor and a storage capacitor.

31. The semiconductor memory as claimed in claim 30, wherein the storage capacitors are trench capacitors.

32. The semiconductor memory as claimed in claim 1, wherein the semiconductor memory comprises a dynamic read/write memory.

33. A semiconductor memory comprising:
  a substrate with a substrate area and with a memory cell array;
  a multiplicity of memory cells disposed in the memory cell area;
  at least one pair of bit lines which comprises a first bit line and a second bit line, where the first bit line and the second bit line respectively have a plurality of memory cells coupled to them;
  at least one sense amplifier to which the first bit line and the second bit line in the pair of bit lines are coupled;
  wherein the first bit line and the second bit line in the at least one pair of bit lines respectively each have a first conductor track structure and a second conductor track structure;

wherein the memory cells are connected to the second conductor track structure of the respective bit line;

wherein the first conductor track structure of the respective bit line is interposed between the sense amplifier and the second conductor track structure of the respective bit line and is arranged at a greater distance from the substrate area than the second conductor track structure of the respective bit line;

wherein the first conductor track structures of the first bit line and of the second bit line are routed away from the sense amplifier in the same direction parallel to one another and have, at an end that is remote from the sense amplifier, an electrically conductive connection to the second conductor track structure of the respective bit line; and a further pair of bit lines with a third bit line and a fourth bit line, which are connected to the same sense amplifier as the first pair of bit lines, where the third bit line and the fourth bit line are arranged on the opposite side of the sense amplifier from the first bit line and the second bit line, and where the sense amplifier selectively amplifies a potential difference between a potential on the first bit line and a potential on the second bit line or a potential difference between a potential on the third bit line and a potential on the fourth bit line.

34. The semiconductor memory as claimed in claim 33, wherein the pair of bit lines and the further pair of bit lines are respectively connected to the sense amplifier via a selection device, the selection device being able to connect the sense amplifier selectively to the pair of bit lines or to the further pair of bit lines.

35. The semiconductor memory as claimed in claim 33, wherein the third bit line and the fourth bit line respectively have a first conductor track structure and a second conductor track structure, where the second conductor track structures connect further memory cells, and where the first conductor track structures are interposed between the second conductor track structures and the sense amplifier.

36. The semiconductor memory as claimed in claim 35, wherein the third bit line and the fourth bit line respectively have a contact hole filling which connects the second conductor track structures to the first conductor track structures.

37. The semiconductor memory as claimed in claim 33, wherein the third bit line and the fourth bit line, which are connected to the first sense amplifier, are designed and oriented in the same way as the first bit line and the second bit line in the pair of bit lines, which is connected to the second sense amplifier.

38. The semiconductor memory as claimed in claim 1, wherein:

the first conductor track structure of the second bit line is formed predominantly from a first conductor track section that is routed away from the sense amplifier; and the first conductor track structure of the second bit line has a second conductor track section that runs in a different direction from the first conductor section parallel to the substrate area.

39. The semiconductor memory as claimed in claim 38, wherein the second conductor track section of the first conductor track structure of the second bit line runs in a direction perpendicular to the course of the first conductor track section of the first conductor track structure of the second bit line.

* * * * *